(12) United States Patent
Koshimizu

(10) Patent No.: US 11,417,502 B2
(45) Date of Patent: Aug. 16, 2022

(54) PLASMA PROCESSING SYSTEM AND SUBSTRATE PROCESSING METHOD

(71) Applicant: Tokyo Electron Limited, Tokyo (JP)

(72) Inventor: Chishio Koshimizu, Miyagi (JP)

(73) Assignee: Tokyo Electron Limited, Tokyo (JP)

( * ) Notice: Subject to any disclaimer, the term of this patent is extended or adjusted under 35 U.S.C. 154(b) by 31 days.

(21) Appl. No.: 17/149,928

(22) Filed: Jan. 15, 2021

(65) Prior Publication Data
US 2021/0233745 A1  Jul. 29, 2021

(30) Foreign Application Priority Data
Jan. 29, 2020 (JP) .............................. JP2020-012239

(51) Int. Cl.
*H01J 37/32* (2006.01)

(52) U.S. Cl.
CPC .. *H01J 37/32183* (2013.01); *H01J 37/32091* (2013.01)

(58) Field of Classification Search
None
See application file for complete search history.

(56) References Cited

FOREIGN PATENT DOCUMENTS

| JP | 2006-270017 A | | 10/2006 | |
|---|---|---|---|---|
| JP | 2006270017 A | * | 10/2006 | ........ H01J 37/32018 |
| KR | 20100037974 A | * | 10/2008 | .............. H05H 1/24 |
| KR | 20150046251 A | * | 8/2012 | .............. H01J 37/32 |

* cited by examiner

*Primary Examiner* — Dedei K Hammond
(74) *Attorney, Agent, or Firm* — Studebaker & Brackett PC

(57) ABSTRACT

In a disclosed plasma processing system, radio frequency power is supplied in a first period to generate plasma, and the power lever of the radio frequency power is set to a reduced power level in a second period. In the second period, bias power is applied to a lower electrode of a substrate support. The bias power changes a potential of the substrate within each cycle that is defined at a second frequency. In the second period, a direct-current voltage is applied to the upper electrode. The direct-current voltage is set such that within each cycle that is defined at the second frequency, a polarity thereof in a first sub-period is negative and an absolute value thereof in the first sub-period is larger than an absolute value thereof in a second sub-period.

11 Claims, 6 Drawing Sheets

PLASMA PROCESSING SYSTEM AND SUBSTRATE PROCESSING METHOD

CROSS-REFERENCE TO RELATED APPLICATIONS

This application is based on and claims the benefit of priority from Japanese Patent Application No. 2020-012239 filed on Jan. 29, 2020, the entire contents of which are incorporated herein by reference.

FIELD

Exemplary embodiments of the present disclosure relate to a plasma processing system and a plasma processing method.

BACKGROUND

A plasma processing apparatus is used for plasma processing of a substrate, such as plasma etching. The plasma processing apparatus is configured to generate plasma in a chamber and process the substrate with chemical species from the plasma. A capacitively coupled plasma processing apparatus is known as one type of the plasma processing apparatus. The capacitively coupled plasma processing apparatus has an upper electrode and a lower electrode. A substrate support that includes the lower electrode supports the substrate in the chamber. The upper electrode is provided above the substrate support. The capacitively coupled plasma processing apparatus generates plasma from a gas in the chamber by generating a radio frequency electric field between the upper electrode and the lower electrode.

A capacitively coupled plasma processing apparatus disclosed in Japanese Unexamined Patent Publication No. 2006-270017 has a direct-current power source connected to an upper electrode. The direct-current power source is configured to apply a negative direct-current voltage to the upper electrode.

SUMMARY

In an exemplary embodiment, a plasma processing system is provided. The plasma processing system includes a chamber, a substrate support, an upper electrode, an RF power source, a bias power source, and a DC power source. The substrate support is disposed in the chamber. The substrate support includes a lower electrode. The upper electrode is disposed above the lower electrode. The RF power source is configured to supply an RF power to the lower electrode or the upper electrode. The RF power has a first frequency. The RF power has a first power level during a first period, and a second power level lower than the first power level during a second period subsequent to the first period. The first period and the second period are repeated in an alternative manner. The bias power source is configured to supply a bias power to the lower electrode during the second period. The bias power has a second frequency lower than the first frequency. Each cycle defined by the second frequency has a first sub-period and a second sub-period. The DC power source is configured to apply a first negative DC voltage to the upper electrode during the first sub-period and apply a second negative DC voltage to the upper electrode during the second sub-period. The first negative DC voltage is lower than the second negative DC voltage.

The foregoing summary is illustrative only and is not intended to be in any way limiting. In addition to the illustrative aspects, exemplary embodiments, and features described above, further aspects, exemplary embodiments, and features will become apparent by reference to the drawings and the following detailed description.

DETAILED DESCRIPTION

Figure 1:
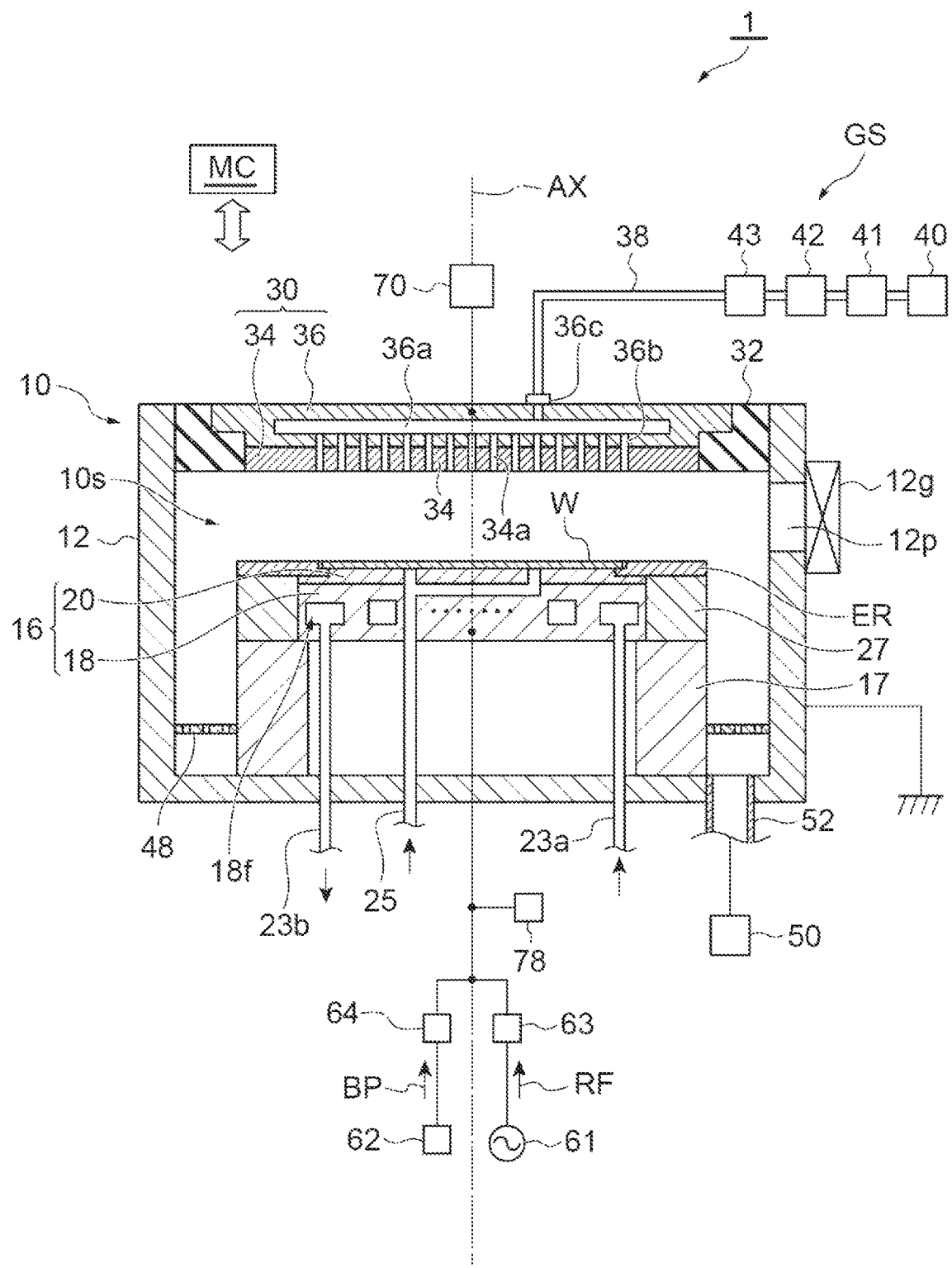
FIG. 1 schematically illustrates a plasma processing apparatus according to an exemplary embodiment.

Hereinafter, various exemplary embodiments will be described.

In an exemplary embodiment, a plasma processing apparatus or system is provided. The plasma processing apparatus includes a chamber, a substrate support, an upper electrode, a radio frequency power source, a bias power source, a direct-current power source, and a controller. The substrate support has a lower electrode. The substrate support is configured to support a substrate in the chamber. The upper electrode is provided above the lower electrode. The radio frequency power source is configured to supply radio frequency power having a first frequency to generate plasma from a gas in the chamber. The bias power source is electrically connected to the lower electrode. The bias power source is configured to supply bias power to draw ions into the substrate placed on the substrate support. The bias power changes a potential of the substrate placed on the substrate support within each cycle that is defined at a second frequency. The direct-current power source is electrically connected to the upper electrode. The controller is configured to control the radio frequency power source, the bias power source, and the direct-current power source. The controller controls the radio frequency power source to supply the radio frequency power in a first period. The controller controls the radio frequency power source to set a power level of the radio frequency power in a second period after the first period to a power level reduced from a power level of the radio frequency power in the first period. The controller controls the bias power source to apply the bias power to the lower electrode within the second period. The controller controls the direct-current power source to apply the direct-current voltage to the upper electrode in the second period. The direct-current voltage in the second period is set such that within each cycle that is defined at the second frequency, a polarity thereof in a first sub-period is negative and an absolute value thereof in the first sub-period is larger than an absolute value thereof in a second sub-period different from the first sub-period.

According to the above embodiment, it is possible to set the polarity of the potential of the substrate when a negative direct-current voltage having a large absolute value is applied to the upper electrode. In a state where the negative direct-current voltage having a large absolute value is applied to the upper electrode when the potential of the substrate is a positive potential, a relatively large amount of electrons are supplied to the substrate. On the other hand, in a state where the negative direct-current voltage having a large absolute value is applied to the upper electrode when the potential of the substrate is a negative potential, the amount of electrons that are supplied to the substrate is small. Therefore, according to the above embodiment, it becomes possible to supply an adjusted amount of electrons from the upper electrode to the substrate. Further, in a state where the negative direct-current voltage having a large absolute value is applied to the upper electrode when the potential of the substrate is a positive potential, the degree of dissociation of the gas in the chamber becomes low. On the other hand, in a state where the negative direct-current voltage having a large absolute value is applied to the upper electrode when the potential of the substrate is a negative potential, the degree of dissociation of the gas in the chamber becomes high. Therefore, according to the above embodiment, it becomes possible to set the degree of dissociation of the gas in the chamber to an adjusted degree of dissociation in the second period.

In an exemplary embodiment, the controller may control the direct-current power source such that an absolute value of the direct-current voltage when the bias power has a positive potential within the second period is larger than an absolute value of the direct-current voltage when the bias power has a negative potential within the second period.

In an exemplary embodiment, the controller may control the direct-current power source such that an absolute value of the direct-current voltage when the bias power has a negative potential within the second period is larger than an absolute value of the direct-current voltage when the bias power has a positive potential within the second period.

In an exemplary embodiment, the controller may control the radio frequency power source and the bias power source to stop supply of the radio frequency power and supply of the bias power in a period between the first period and the second period.

In an exemplary embodiment, the controller may control the direct-current power source to apply a direct-current voltage to the upper electrode in a period between the first period and the second period. The direct-current voltage that is applied to the upper electrode in the period between the first period and the second period has an absolute value smaller than the minimum absolute value of the direct-current voltage that is applied to the upper electrode in the first sub-period, and has a negative polarity. According to this embodiment, in the period between the first period and the second period, a relatively small amount of electrons are emitted from the upper electrode into the chamber. As a result, the plasma can be reliably maintained even in the period between the first period and the second period.

In an exemplary embodiment, the controller may control the direct-current power source to apply a direct-current voltage having an absolute value smaller than the minimum absolute value of the direct-current voltage that is applied to the upper electrode in the first sub-period and having a negative polarity, to the upper electrode in the first period.

In an exemplary embodiment, a level of the direct-current voltage that is applied to the upper electrodes by the direct-current power source in the first sub-period may change to maintain a constant potential difference between the upper electrode and the lower electrode.

In an exemplary embodiment, a level of the direct-current voltage in the second sub-period may be zero.

In an exemplary embodiment, the bias power may be radio frequency bias power having a second frequency.

In an exemplary embodiment, the bias power may be a direct-current voltage in which a polarity thereof is negative in one sub-period of two sub-periods within each cycle that is defined at the second frequency. In this embodiment, the bias power may be a direct-current voltage in which in the other sub-period of the two sub-periods, a level thereof is zero or a polarity thereof is negative, and an absolute value thereof is smaller than an absolute value thereof in the one sub-period.

In another exemplary embodiment, a plasma processing method or substrate processing method is provided. A plasma processing apparatus that is used in the plasma processing method includes a chamber, a substrate support, an upper electrode, a radio frequency power source, a bias power source, a direct-current power source, and a controller. The substrate support has a lower electrode. The substrate support is configured to support a substrate in the chamber. The upper electrode is provided above the lower electrode. The radio frequency power source is configured to supply radio frequency power having a first frequency to generate plasma from a gas in the chamber. The bias power source is electrically connected to the lower electrode. The bias power source is configured to supply bias power to draw ions into the substrate placed on the substrate support. The bias power changes a potential of the substrate placed on the substrate support within each cycle that is defined at a second frequency. The direct-current power source is electrically connected to the upper electrode. The plasma processing method includes supplying the radio frequency power in a first period. The plasma processing method further includes setting a power level of the radio frequency power in a second period after the first period to a power level reduced from the power level of the radio frequency power in the first period. The plasma processing method further includes applying the bias power to the lower electrode within the second period. The plasma processing method further includes applying a direct-current voltage from the direct-current power source to the upper electrode in the second period. The direct-current voltage is set such that within each cycle that is defined at the second frequency, a polarity thereof in a first sub-period is negative and an absolute value thereof in the first sub-period is larger than an absolute value thereof in a second sub-period different from the first sub-period.

Hereinafter, various exemplary embodiments will be described in detail with reference to the drawings. In the drawing, the same or equivalent portions are denoted by the same reference symbols.

FIG. 1 schematically illustrates a plasma processing apparatus according to an exemplary embodiment. A plasma processing apparatus 1 or plasma processing system shown in FIG. 1 is a capacitively coupled plasma processing apparatus. The plasma processing apparatus 1 is provided with a chamber 10. The chamber 10 provides an internal space 10s therein. The central axis of the internal space 10s is an axis AX which extends in the vertical direction.

In an embodiment, the chamber 10 includes a chamber body 12. The chamber body 12 has a substantially cylindrical shape. The internal space 10s is provided in the chamber body 12. The chamber body 12 is formed of, for example, aluminum. The chamber body 12 is electrically grounded. A film having plasma resistance is formed on the inner wall surface of the chamber body 12, that is, the wall surface defining the internal space 10s. The film can be a film formed by anodization or a ceramic film such as a film formed of yttrium oxide.

A passage 12p is formed in a side wall of the chamber body 12. A substrate W passes through the passage 12p when it is transferred between the internal space 10s and the outside of the chamber 10. A gate valve 12g is provided along the side wall of the chamber body 12 for opening and closing of the passage 12p.

The plasma processing apparatus 1 is further provided with a substrate support 16. The substrate support 16 is configured to support the substrate W which is placed thereon in the chamber 10. The substrate W has a substantially disk shape. The substrate support 16 is supported by the support 17. The support 17 extends upward from a bottom portion of the chamber body 12. The support 17 has a substantially cylindrical shape. The support 17 is formed of an insulating material such as quartz.

The substrate support 16 has a lower electrode 18 and an electrostatic chuck 20. The lower electrode 18 and the electrostatic chuck 20 are provided in the chamber 10. The lower electrode 18 is formed of a conductive material such as aluminum and has a substantially disk shape.

A flow path 18f is formed in the lower electrode 18. The flow path 18f is a flow path for a heat exchange medium. As the heat exchange medium, a liquid refrigerant or a refrigerant (for example, chlorofluorocarbon) that cools the lower electrode 18 by vaporization thereof is used. A supply device of the heat exchange medium (for example, a chiller unit) is connected to the flow path 18f. The supply device is provided outside the chamber 10. The heat exchange medium is supplied to the flow path 18f from the supply device through a pipe 23a. The heat exchange medium supplied to the flow path 18f is returned to the supply device through a pipe 23b.

The electrostatic chuck 20 is provided on the lower electrode 18. The substrate W is placed on the electrostatic chuck 20 and held by the electrostatic chuck 20 when it is processed in the internal space 10s.

The electrostatic chuck 20 has a main body and an electrode. The main body of the electrostatic chuck 20 is formed of a dielectric such as aluminum oxide or aluminum nitride. The main body of the electrostatic chuck 20 has a substantially disk shape. The central axis of the electrostatic chuck 20 substantially coincides with the axis AX. The electrode of the electrostatic chuck 20 is provided in the main body. The electrode of the electrostatic chuck 20 has a film shape. A direct-current power source is electrically connected to the electrode of the electrostatic chuck 20 through a switch. When the voltage from the direct-current power source is applied to the electrode of the electrostatic chuck 20, an electrostatic attraction force is generated between the electrostatic chuck 20 and the substrate W. Due to the generated electrostatic attraction force, the substrate W is attracted to the electrostatic chuck 20 and held by the electrostatic chuck 20.

The electrostatic chuck 20 includes a substrate placing region. The substrate placing region is a region having a substantially disk shape. The central axis of the substrate placing region substantially coincides with the axis AX. The substrate W is placed on the upper surface of the substrate placing region when it is processed in the chamber 10.

In an exemplary embodiment, the electrostatic chuck 20 may further include an edge ring placing region. The edge ring placing region extends in a circumferential direction to surround the substrate placing region around the central axis of the electrostatic chuck 20. An edge ring ER is mounted on the upper surface of the edge ring placing region. The edge ring ER has a ring shape. The edge ring ER is placed on the edge ring placing region such that the central axis thereof coincides with the axis AX. The substrate W is disposed in a region surrounded by the edge ring ER. That is, the edge ring ER is disposed to surround the edge of the substrate W. The edge ring ER may have electrical conductivity. The edge ring ER is formed of, for example, silicon or silicon carbide. The edge ring ER may be formed of a dielectric such as quartz.

The plasma processing apparatus 1 may be further provided with a gas supply line 25. The gas supply line 25 supplies a heat transfer gas, for example, He gas, from a gas supply mechanism to a gap between the upper surface of the electrostatic chuck 20 and the rear surface (lower surface) of the substrate W.

The plasma processing apparatus 1 may be further provided with an insulating region 27. The insulating region 27 is disposed on the support 17. The insulating region 27 is disposed outside the lower electrode 18 in a radial direction with respect to the axis AX. The insulating region 27 extends in the circumferential direction along the outer peripheral surface of the lower electrode 18. The insulating region 27 is formed of an insulator such as quartz. The edge ring ER is placed on the insulating region 27 and the edge ring placing region.

The plasma processing apparatus 1 is further provided with an upper electrode 30. The upper electrode 30 is provided above the substrate support 16. The upper electrode 30 closes an upper opening of the chamber body 12 together with a member 32. The member 32 has insulation properties. The upper electrode 30 is supported on an upper portion of the chamber body 12 through the member 32.

The upper electrode 30 includes a ceiling plate 34 and a support 36. The lower surface of the ceiling plate 34 defines the internal space 10s. A plurality of gas discharge holes 34a are formed in the ceiling plate 34. Each of the plurality of gas discharge holes 34a penetrates the ceiling plate 34 in a plate thickness direction (the vertical direction). Although being not limited, the ceiling plate 34 is formed of silicon, for example. Alternatively, the ceiling plate 34 may have a structure in which a plasma-resistant film is provided on the surface of a member made of aluminum. The film may be a film formed by anodization or a ceramic film such as a film formed of yttrium oxide.

The support 36 detachably supports the ceiling plate 34. The support 36 is formed of a conductive material such as aluminum, for example. A gas diffusion chamber 36a is provided in the interior of the support 36. A plurality of gas holes 36b extend downward from the gas diffusion chamber 36a. The plurality of gas holes 36b communicate with the plurality of gas discharge holes 34a, respectively. A gas introduction port 36c is formed in the support 36. The gas introduction port 36c is connected to the gas diffusion chamber 36a. A gas supply pipe 38 is connected to the gas introduction port 36c.

A gas source group 40 is connected to the gas supply pipe 38 through a valve group 41, a flow rate controller group 42, and a valve group 43. The gas source group 40, the valve group 41, the flow rate controller group 42, and the valve group 43 configure a gas supply unit GS. The gas source group 40 includes a plurality of gas sources. Each of the valve group 41 and the valve group 43 includes a plurality of valves (for example, on-off valves). The flow rate controller group 42 includes a plurality of flow rate controllers. Each of the plurality of flow rate controllers of the flow rate controller group 42 is a mass flow controller or a pressure control type flow rate controller. Each of the plurality of gas sources of the gas source group 40 is connected to the gas supply pipe 38 through a corresponding valve of the valve group 41, a corresponding flow rate controller of the flow rate controller group 42, and a corresponding valve of the valve group 43. The plasma processing apparatus 1 can supply one or more gases from one or more gas sources selected from the plurality of gas sources of the gas source group 40 to the internal space 10s at individually adjusted flow rates.

A baffle plate 48 is provided between the substrate support 16 or the support 17 and the side wall of the chamber body 12. The baffle plate 48 may be configured, for example, by coating a member made of aluminum with ceramic such as yttrium oxide. A number of through-holes are formed in the baffle plate 48. An exhaust pipe 52 is connected to the bottom portion of the chamber body 12 below the baffle plate 48. An exhaust device 50 is connected to the exhaust pipe 52. The exhaust device 50 includes a pressure controller such as an automatic pressure control valve, and a vacuum pump such as a turbo molecular pump, and is capable of reducing the pressure in the internal space 10s.

The plasma processing apparatus 1 is further provided with a radio frequency power source 61. The radio frequency power source 61 is a power source that generates radio frequency power RF. The radio frequency power RF is used to generate plasma from the gas in the chamber 10. The radio frequency power RF has a first frequency. The first frequency is a frequency in the range of 27 to 100 MHz, for example, a frequency of 40 MHz or 60 MHz. The radio frequency power source 61 is connected to the lower electrode 18 through a matching circuit 63 to supply the radio frequency power RF to the lower electrode 18. The matching circuit 63 is configured to match the output impedance of the radio frequency power source 61 with the impedance on the load side (the lower electrode 18 side). The radio frequency power source 61 may not be electrically connected to the lower electrode 18 and may be connected to the upper electrode 30 through the matching circuit 63.

The plasma processing apparatus 1 is further provided with a bias power source 62. The bias power source 62 is electrically connected to the lower electrode 18. In an embodiment, the bias power source 62 is connected to the lower electrode 18 through a circuit 64. The bias power source 62 is configured to generate bias power BP that is supplied to the lower electrode 18. The bias power BP is used to draw ions into the substrate W placed on the substrate support 16. The bias power BP is set to change the potential of the substrate W placed on the substrate support 16 within each cycle that is defined at a second frequency. The bias power BP may change the potential of the substrate W placed on the substrate support 16 to a positive potential and a negative potential within each cycle that is defined at the second frequency. The second frequency may be a frequency lower than the first frequency. The second frequency is, for example, 50 kHz or more and 27 MHz or less.

In an embodiment, the bias power BP is radio frequency bias power. The radio frequency bias power is radio frequency power having the second frequency. In a case where the bias power BP is the radio frequency bias power, the circuit 64 is a matching circuit and is configured to match the output impedance of the bias power BP with the impedance on the load side (lower electrode 18 side).

Figure 4:
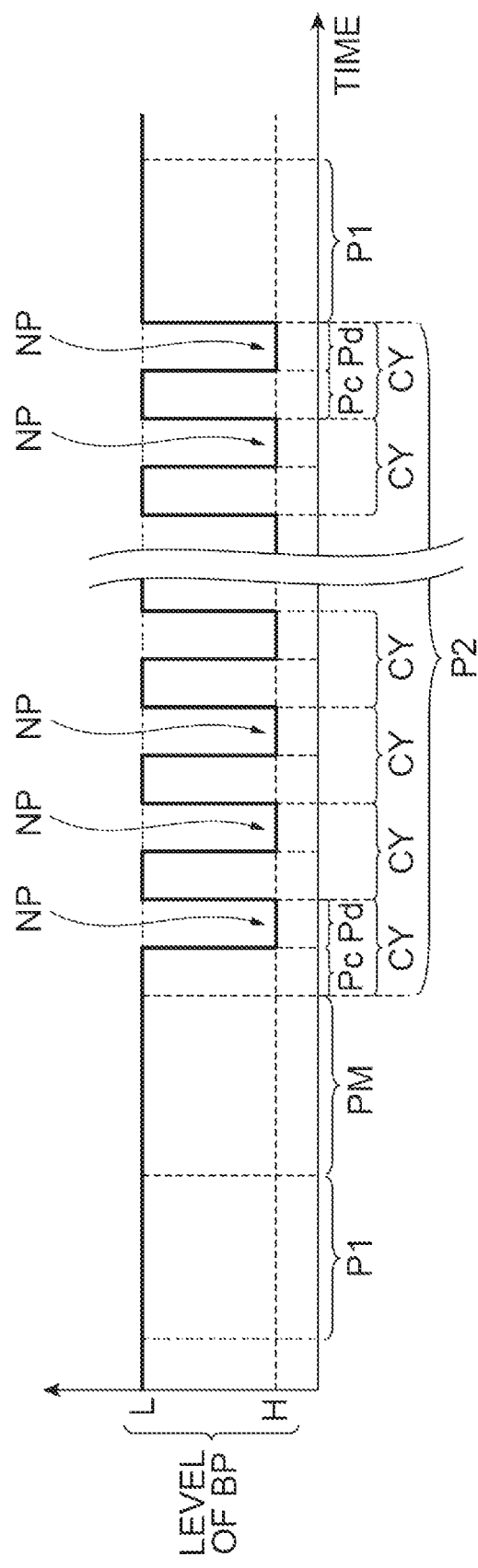
FIG. 4 is a timing chart showing another example of the bias power.

Alternatively, the bias power source 62 may be configured to periodically apply a pulse NP of a negative direct-current voltage to the lower electrode 18 with a cycle CY that is defined at the second frequency (refer to FIG. 4). Each cycle CY includes two sub-periods Pc and Pd. The pulse NP of the negative direct-current voltage is applied to the lower electrode 18 in one sub-period Pd of the two sub-periods. In the other sub-period Pc of the two sub-periods, the pulse NP of the negative direct-current voltage is not applied to the lower electrode 18. Alternatively, the absolute value of the direct-current voltage that is applied from the bias power source 62 to the lower electrode 18 in the sub-period Pc may be smaller than the absolute value of the direct-current voltage (that is, the pulse NP of the negative direct-current voltage) that is applied from the bias power source 62 to the lower electrode 18 in the sub-period Pd. That is, the direct-current voltage that is applied from the bias power source 62 to the lower electrode 18 in one sub-period of the two sub-periods Pc and Pd has a first negative level. The direct-current voltage that is applied from the bias power source 62 to the lower electrode 18 in the other sub-period of the two sub-periods Pc and Pd has a level at zero or a second negative level. The second negative level is higher than the first negative level. In a case where the pulse NP of the negative direct-current voltage is applied to the lower electrode 18 as the bias power BP, the circuit 64 may be a low-pass filter.

The plasma processing apparatus 1 is further provided with a direct-current power source 70. The direct-current power source 70 is electrically connected to the upper electrode 30. The direct-current power source 70 is configured to generate a direct-current voltage DCS that is applied to the upper electrode 30.

In an embodiment, the plasma processing apparatus 1 may be further provided with a voltage sensor 78. The voltage sensor 78 is configured to directly or indirectly measure the potential of the substrate W. In the example shown in FIG. 1, the voltage sensor 78 is configured to measure the potential of the lower electrode 18. Specifically, the voltage sensor 78 measures the potential of a power supply path connected between the lower electrode 18 and the bias power source 62.

In a case where plasma processing is performed in the plasma processing apparatus 1, a gas is supplied to the internal space 10s. Then, the radio frequency power RF is supplied, whereby the gas is excited in the internal space 10s. As a result, plasma is generated in the internal space 10s. The substrate W supported by the substrate support 16 is processed by chemical species such as ions and radicals from the plasma. For example, the substrate is etched by the chemical species from the plasma. In the plasma processing apparatus 1, the bias power BP is supplied to the lower electrode 18, whereby positive ions from the plasma are accelerated toward the substrate W. Further, in the plasma processing apparatus 1, the negative direct-current voltage is applied to the upper electrode 30, whereby the positive ions from the plasma collide with the upper electrode 30 (the ceiling plate 34). As a result, electrons are emitted from the upper electrode 30. When the electrons emitted from the upper electrode 30 are supplied to the substrate W, the charging amount of the substrate W due to a positive charge decreases. As a result, it becomes possible to cause the positive ions to reach the bottom of an opening formed in the substrate W.

The plasma processing apparatus 1 is further provided with a controller MC. The controller MC is a computer which includes a processor, a storage device, an input device, a display device, and the like, and controls each part of the plasma processing apparatus 1. The controller MC executes a control program stored in the storage device and controls each part of the plasma processing apparatus 1, based on recipe data stored in the storage device. A process designated by the recipe data is performed in the plasma processing apparatus 1 under the control by the controller MC. A plasma processing method or substrate processing method to be described later may be performed in the plasma processing apparatus 1 under the control of each part of the plasma processing apparatus 1 by the controller MC.

Figure 2:
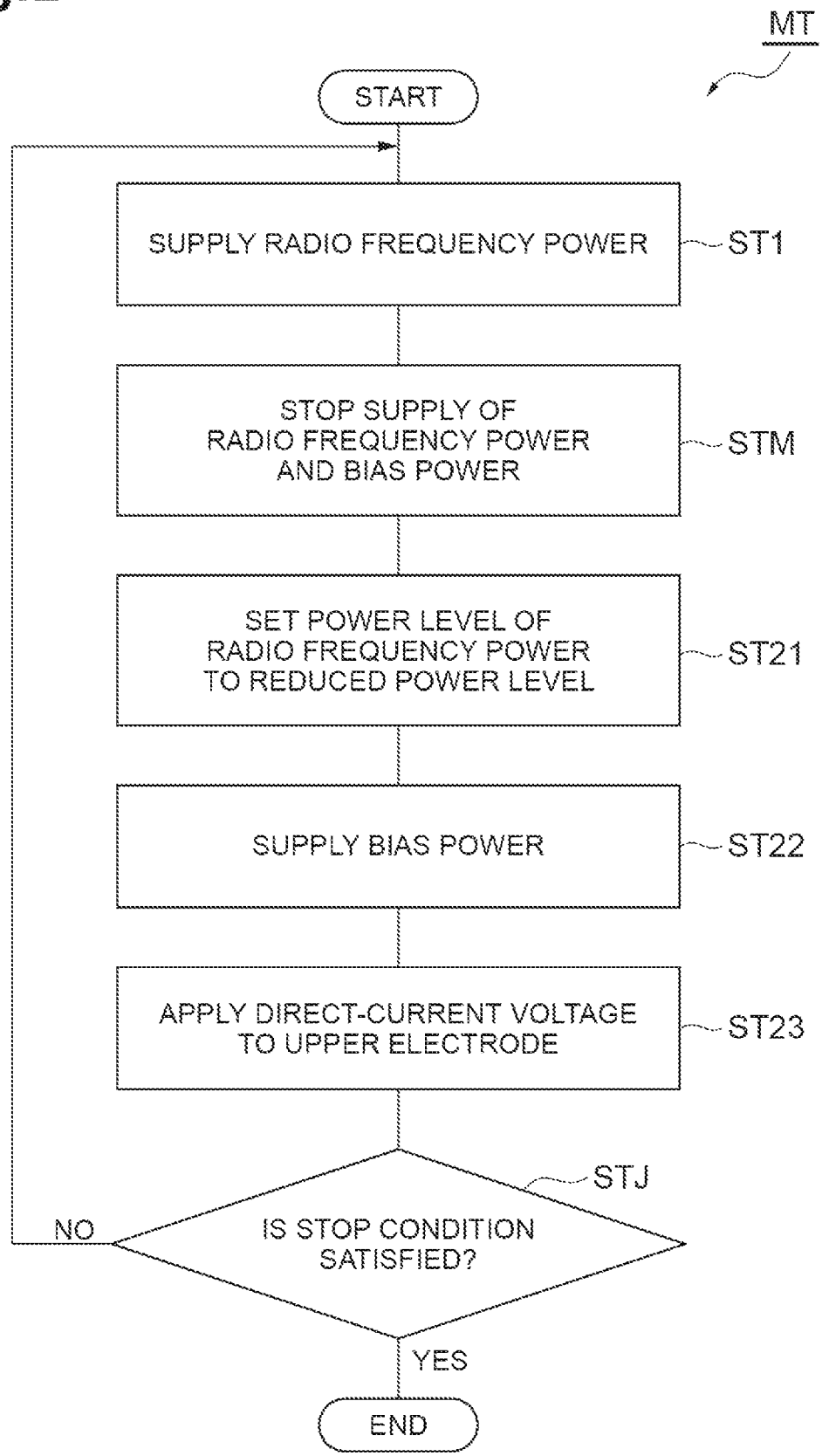
FIG. 2 is a flowchart of a plasma processing method according to an exemplary embodiment.
Figure 3:
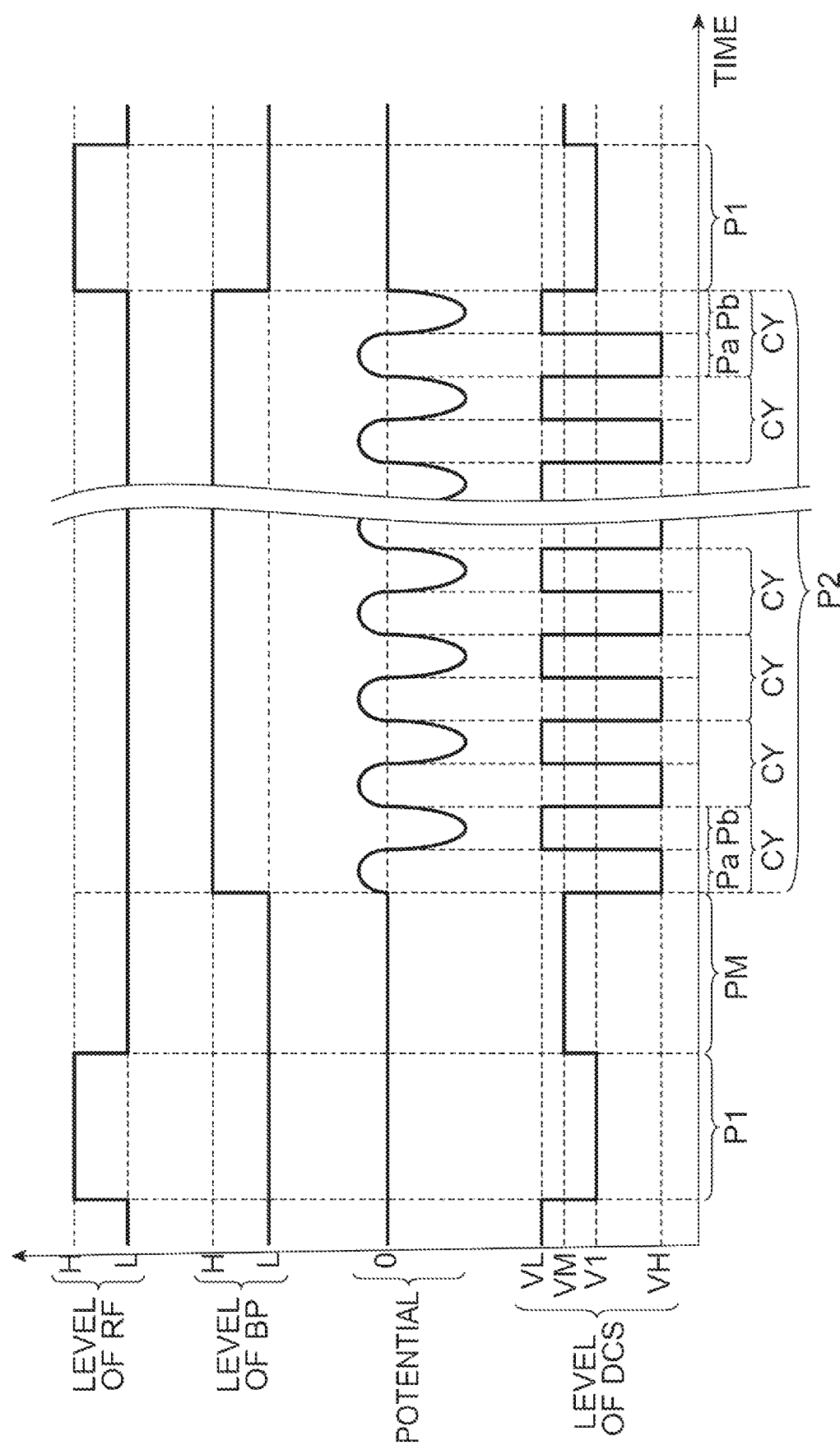
FIG. 3 is a timing chart of a level of bias power BP, a power level of radio frequency power RF, a potential, and an example of a direct-current voltage DCS in the plasma processing apparatus shown in FIG. 1.
Figure 5:
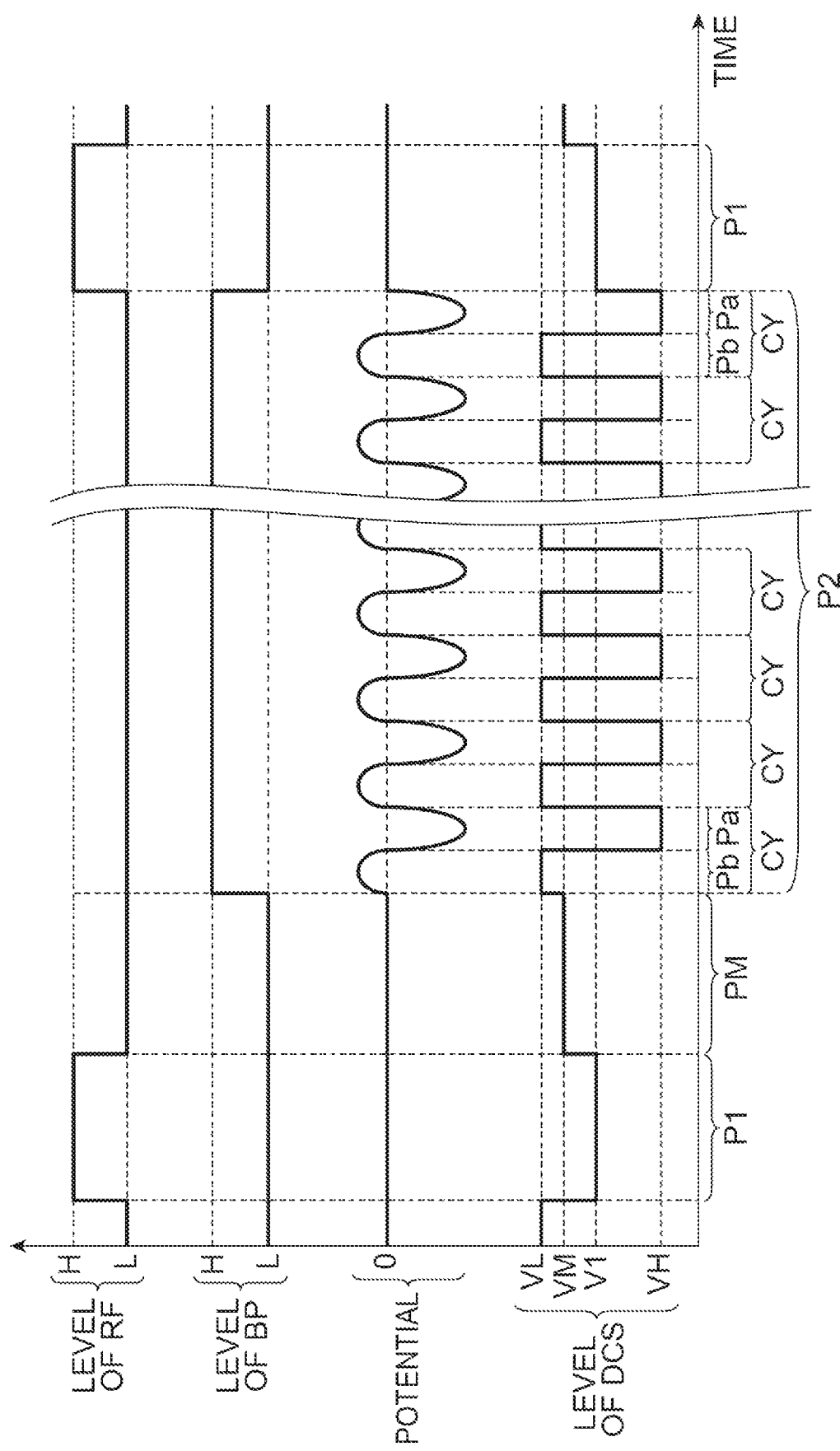
FIG. 5 is a timing chart of the level of the bias power BP, the power level of the radio frequency power RF, the potential (the potential of the substrate W or the lower electrode 18), and another example of the direct-current voltage DCS in the plasma processing apparatus shown in FIG. 1.
Figure 6:
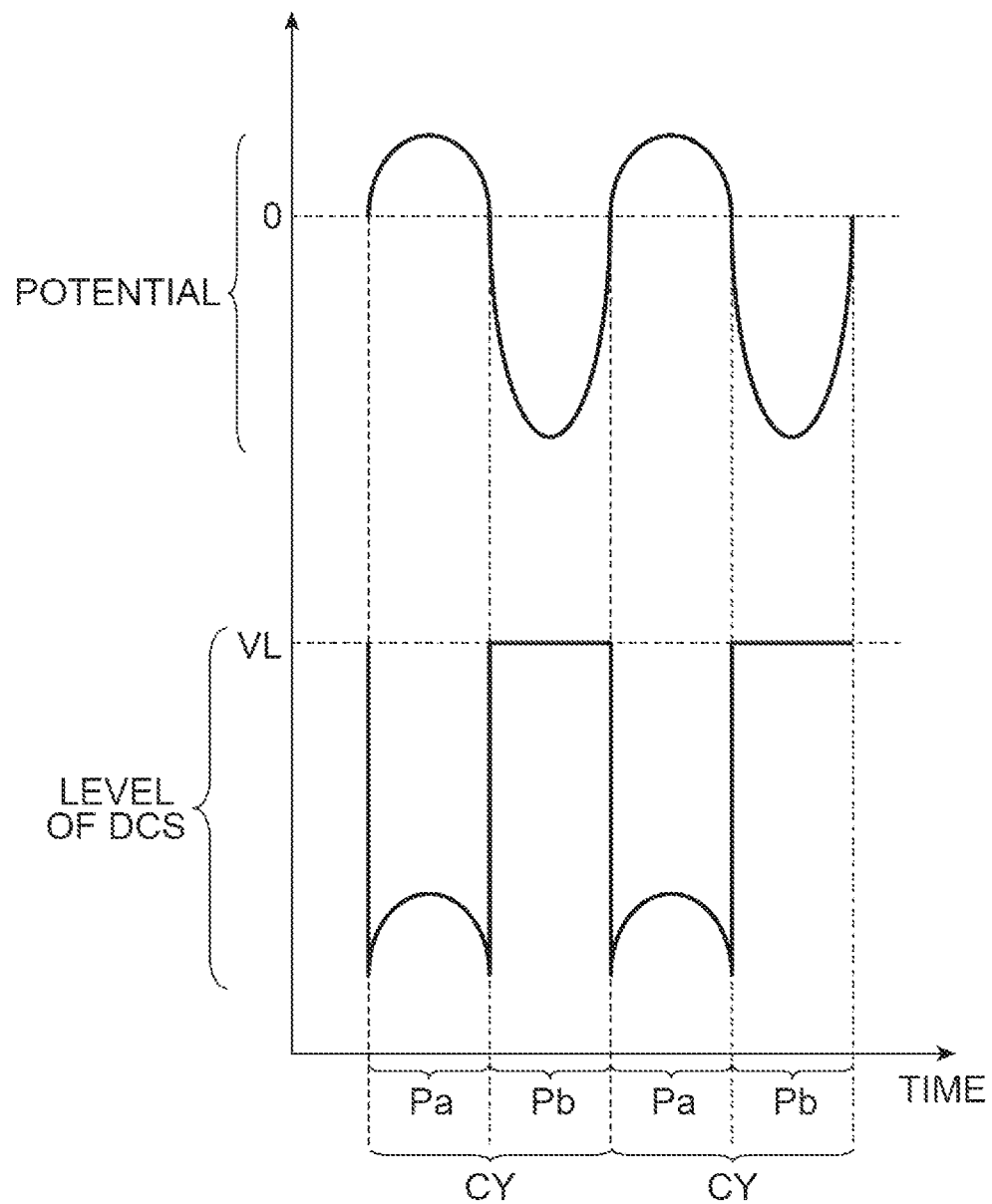
FIG. 6 is a timing chart of another example of the direct-current voltage DCS.

Hereinafter, FIGS. 2 to 6 are referred to. FIG. 2 is a flowchart of a plasma processing method according to an exemplary embodiment. FIG. 3 is a timing chart of the level of the bias power BP, the power level of the radio frequency power RF, a potential (the potential of the substrate W or the lower electrode 18), and an example of the direct-current voltage DCS in the plasma processing apparatus shown in FIG. 1. FIG. 4 is a timing chart showing another example of the bias power. FIG. 5 is a timing chart of the level of the bias power BP, the power level of the radio frequency power RF, the potential (the potential of the substrate W or the lower electrode 18), and another example of the direct-current voltage DCS in the plasma processing apparatus shown in FIG. 1. FIG. 6 is a timing chart of another example of the direct-current voltage DCS. Hereinafter, the plasma processing method or substrate processing method (hereinafter, referred to as a "method MT") according to an exemplary embodiment will be described with reference to FIGS. 2 to 6. In addition, the control of the radio frequency power source 61, the bias power source 62, and the direct-current power source 70 by the controller MC will be described.

The method MT is performed in a state where the substrate W is placed on the substrate support 16. The method MT includes step ST1, step ST21, step ST22, and step ST23. The method MT may further include step STM. While each of these steps of the method MT is performed, the gas from the gas supply unit GS may be supplied into the chamber 10. Further, while each of these steps of the method MT is performed, the pressure of the gas in chamber 10 is set to a designated pressure. To perform each of these steps of the method MT, the controller MC controls the gas supply unit GS and the exhaust device 50.

Step ST1 is performed in a first period P1. Steps ST21, ST22, and ST23 are performed in a second period P2 after the first period P1. By performing step ST1, the radio frequency power RF is supplied from the radio frequency power source 61 in the first period P1, as shown in FIGS. 3 and 5. In FIGS. 3 and 5, the power level of the radio frequency power RF in the first period P1 is shown as an "H" level, that is, a high level. In the first period P1, a continuous wave of the radio frequency power RF may be supplied. Alternatively, in the first period P1, a pulse of the radio frequency power RF may be supplied periodically. To perform step ST1, the controller MC controls the radio frequency power source 61 to supply the radio frequency power RF in the first period P1. By performing step ST1, plasma is generated from the gas in the chamber 10.

In a case where the bias power BP is the radio frequency bias power, the radio frequency bias power is not supplied to the lower electrode 18 in the first period P1. Alternatively, in a case where the bias power BP is the radio frequency bias power, in the first period P1, the power level of the radio frequency bias power is set to a power level lower than the power level ("H" level) of the radio frequency bias power in the second period P2. In FIGS. 3 and 5, the power level of the radio frequency bias power in the first period P1 is shown as an "L" level.

The bias power BP may be the pulse NP of the negative direct-current voltage (refer to FIG. 4) that is periodically applied to the lower electrode 18 with the cycle CY, as described above. In a case where the pulse NP of the negative direct-current voltage is used as the bias power BP, the pulse NP of the negative direct-current voltage is not applied to the lower electrode 18 in the first period P1. Alternatively, the level of the pulse NP of the negative direct-current voltage in the first period P1 is set to an absolute value smaller than the absolute value ("H" level) of the pulse NP of the negative direct-current voltage in the second period P2. In FIG. 4, the absolute value of the pulse NP of the negative direct-current voltage in the first period P1 is shown as an "L" level.

As described above, the bias power BP changes the potential of the substrate W or the lower electrode 18 within each cycle CY. As shown in FIGS. 3 and 4, in a case where the bias power BP is not supplied to the lower electrode 18 in the first period P1, the potential of the substrate W or the lower electrode 18 may be zero.

In the first period P1, the negative direct-current voltage DCS may not be applied from the direct-current power source 70 to the upper electrode 30. Alternatively, in the first period P1, the negative direct-current voltage DCS may be applied from the direct-current power source 70 to the upper electrode 30. The direct-current voltage DCS that is applied to the upper electrode 30 in the first period P1 has an absolute value smaller than the minimum absolute value of the negative direct-current voltage DCS that is applied to the upper electrode 30 in a first sub-period Pa in each cycle CY in the second period P2. In FIGS. 3 and 5, the level of the direct-current voltage DCS (a fourth negative DC voltage) that is applied to the upper electrode 30 in the first period P1 is shown as a "V1" level. Further, the level of the negative direct-current voltage DCS that is applied to the upper electrode 30 in the first sub-period Pa is shown as a "VH" level. Each cycle CY includes the first sub-period Pa and the second sub-period Pb. The second sub-period Pb is a period different from the first sub-period Pa.

In the first period P1, the controller MC controls the radio frequency power source 61, the bias power source 62, and the direct-current power source 70 to set the power level of the radio frequency power RF, the level of the bias power BP, and the absolute value of the negative direct-current voltage DCS, as described above.

In an embodiment, step STM may be performed between step ST1 and step ST21. The step STM is performed in a period PM (break period) between the first period P1 and the second period P2. By performing step STM, the supply of the radio frequency power RF and the supply of the bias power BP are stopped in the period PM. To perform step STM, the controller MC controls the radio frequency power source 61 to stop the supply of the radio frequency power RF in the period PM. Further, to perform step STM, the controller MC controls the bias power source 62 to stop the supply of the bias power in the period PM. In a case where the plasma processing that is performed in the method MT is plasma etching, the amount of deposits on the substrate W can increase in the period PM. Alternatively, or in addition, the discharge of a reaction product from the opening formed in the substrate W is promoted in the period PM.

In the period PM, the negative direct-current voltage DCS may not be applied from the direct-current power source 70 to the upper electrode 30. Alternatively, in the period PM, the negative direct-current voltage DCS (a third negative DC voltage) may be applied from the direct-current power source 70 to the upper electrode 30. The direct-current voltage DCS that is applied to the upper electrode 30 in the period PM has an absolute value smaller than the minimum absolute value of the negative direct-current voltage DCS that is applied to the upper electrode 30 in the first sub-period Pa. In FIGS. 3 and 5, the level of the direct-current voltage DCS that is applied to the upper electrode 30 in the period PM is shown as a "VM" level. In the period PM, the controller MC controls the direct-current power source 70 to set the level of the direct-current voltage DCS, as described above. In a case where the negative direct-current voltage DCS having such an absolute value is applied to the upper electrode in the period PM, a relatively small amount of electrons are emitted from the upper electrode 30 into the chamber 10. As a result, the plasma can be reliably maintained in the period PM.

As described above, steps ST21, ST22, and ST23 are performed in the second period P2 after the first period P1. By performing step ST21, in the second period P2, the power level (a second power level) of the radio frequency power RF is set to a power level reduced from the power level (a first power level) of the radio frequency power RF in the first period P1. The power level of the radio frequency power RF in the second period P2 may be zero. That is, the supply of the radio frequency power RF in the second period P2 may be stopped. To perform step ST21, the controller MC controls the radio frequency power source 61 to set the power level of the radio frequency power RF in the second period P2 to such a power level.

Step ST22 is performed while step ST21 is performed. By performing step ST22, the bias power BP is supplied from the bias power source 62 to the lower electrode 18 in the second period P2. The bias power BP is set to change the potential of the substrate W placed on the substrate support 16 to a positive potential and a negative potential within each cycle CY that is defined at the second frequency, as described above. The bias power BP may be the radio frequency bias power, as described above. Alternatively, the bias power BP may include the pulse NP of the negative direct-current voltage that is periodically applied to the lower electrode 18 with the cycle CY that is defined at the second frequency, as described above. To perform step ST22, the controller MC controls the bias power source 62 to apply the bias power BP to the lower electrode 18 in the second period P2.

Step ST23 is performed while steps ST21 and ST22 are performed. By performing of step ST23, the direct-current voltage DCS is applied from the direct-current power source 70 to the upper electrode 30 in the second period P2. The direct-current voltage DCS in the second period P2 is set such that the polarity thereof in the first sub-period Pa within each cycle CY is negative and the absolute value thereof in the first sub-period Pa is larger than the absolute value thereof in the second sub-period Pb. In FIGS. 3 and 5, the level of the direct-current voltage DCS (a first negative DC voltage) in the first sub-period Pa is shown as a "VH" level. In the second sub-period Pb, the direct-current voltage DCS may not be applied to the upper electrode 30. Alternatively, the direct-current voltage DCS (a second negative DC voltage) that is applied to the upper electrode 30 in the second sub-period Pb may be set such that the polarity thereof is negative and the absolute value thereof is smaller than the absolute value thereof in the first sub-period Pa. In FIGS. 3 and 5, the level of the direct-current voltage DCS in the second sub-period Pb is shown as a "VL" level. To perform step ST23, the controller MC controls the direct-current power source 70 to apply the direct-current voltage DCS to the upper electrode 30 in the second period P2.

In an embodiment, as shown in FIG. 6, the level of the direct-current voltage DCS that is applied to the upper electrode 30 by the direct-current power source 70 in the first sub-period Pa may change to maintain a constant potential difference between the upper electrode 30 and the lower electrode 18. According to this embodiment, it becomes possible to narrow the distribution of the energy of the electrons that are emitted from the upper electrode 30 and supplied to the substrate W.

In an embodiment, as shown in FIG. 3, the direct-current voltage DCS may be set such that the absolute value thereof when the substrate W or the lower electrode 18 has a positive potential is larger than the absolute value thereof when the substrate W or the lower electrode 18 has a negative potential. For example, the direct-current voltage DCS may be set such that the absolute value thereof when the bias power BP has a positive potential is larger than the absolute value thereof when the bias power BP has a negative potential. In this embodiment, the first sub-period Pa is set to overlap a period in which the substrate W or the lower electrode 18 has a positive potential. Further, the second sub-period Pb is set to overlap a period in which the substrate W or the lower electrode 18 has a negative potential. The first sub-period Pa and the second sub-period Pb may be stored in the storage device of the controller MC as data determined in advance, or may be designated by the controller MC by using this data. Alternatively, the first sub-period Pa and the second sub-period Pb may be designated by the controller MC according to a potential that is measured by the voltage sensor 78. In this embodiment, when the potential of the substrate W is a positive potential, the direct-current voltage DCS having a large absolute value is applied to the upper electrode 30. Therefore, the amount of electrons that are emitted from the upper electrode 30 and supplied to the substrate W increases.

In an embodiment, as shown in FIG. 5, the direct-current voltage DCS may be set such that the absolute value thereof when the substrate W or the lower electrode 18 has a negative potential is larger than the absolute value thereof when the substrate W or the lower electrode 18 has a positive potential. For example, the direct-current voltage DCS may be set such that the absolute value thereof when the bias power BP has a negative potential is larger than the absolute value thereof when the bias power BP has a positive potential. In this embodiment, the first sub-period Pa is set to overlap a period in which the substrate W or the lower electrode 18 has a negative potential. Further, the second sub-period Pb is set to overlap a period in which the substrate W or the lower electrode 18 has a positive potential. The first sub-period Pa and the second sub-period Pb may be stored in the storage device of the controller MC as data determined in advance, or may be designated by the controller MC by using this data. Alternatively, the first sub-period Pa and the second sub-period Pb may be designated by the controller MC according to a potential that is measured by the voltage sensor 78. In this embodiment, when the potential of the substrate W is a negative potential, the direct-current voltage DCS having a large absolute value is applied to the upper electrode 30. Therefore, the amount of electrons that are emitted from the upper electrode 30 and supplied to the substrate W is reduced. In this embodiment, the electrons that are emitted from the upper electrode 30 increase the degree of dissociation of the gas in the chamber 10.

As shown in FIG. 2, in an embodiment, a cycle that includes step ST1, step ST21, step ST22, and step ST23 may be repeated. This cycle may further include step STM. In this case, whether or not a stop condition is satisfied is determined, in step STJ. The stop condition is satisfied in a case where the number of times that the cycle has been performed reaches a predetermined number of times. When in step STJ, it is determined that the stop condition is not satisfied, the cycle is repeated. When in step STJ, it is determined that the stop condition is satisfied, the method MT ends.

As described above, in the plasma processing apparatus 1, it is possible to set the polarity of the potential of the substrate W when the negative direct-current voltage DCS having a large absolute value is applied to the upper electrode 30. In a state where the negative direct-current voltage DCS having a large absolute value is applied to the upper electrode 30 when the potential of the substrate W is a positive potential, a relatively large amount of electrons are supplied to the substrate W. On the other hand, in a state where the negative direct-current voltage DCS having a large absolute value is applied to the upper electrode 30 when the potential of the substrate W is a negative potential, the amount of electrons that are supplied to the substrate W is small. Therefore, it becomes possible to supply an adjusted amount of electrons from the upper electrode 30 to the substrate W. Further, in a state where the negative direct-current voltage DCS having a large absolute value is applied to the upper electrode 30 when the potential of the substrate W is a positive potential, the degree of dissociation of the gas in the chamber 10 becomes low. On the other hand, in a state where the negative direct-current voltage DCS having a large absolute value is applied to the upper electrode 30 when the potential of the substrate W is a negative potential, the degree of dissociation of the gas in the chamber 10 becomes high. Therefore, it becomes possible to set the degree of dissociation of the gas in the chamber 10 to an adjusted degree of dissociation in the second period P2.

While various exemplary embodiments have been described above, various additions, omissions, substitutions and changes may be made without being limited to the exemplary embodiments described above. Elements of the different embodiments may be combined to form another embodiment.

From the foregoing description, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. A plasma processing system comprising:
a chamber;
a substrate support disposed in the chamber, the substrate support including a lower electrode;
an upper electrode disposed above the lower electrode;
an RF power source configured to supply an RF power to the lower electrode or the upper electrode, the RF power having a first frequency, the RF power having a first power level during a first period, and a second power level lower than the first power level during a second period subsequent to the first period, the first period and the second period being repeated in an alternative manner;
a bias power source configured to supply a bias power to the lower electrode during the second period, the bias power having a second frequency lower than the first frequency, each cycle defined by the second frequency having a first sub-period and a second sub-period; and
a DC power source configured to apply a first negative DC voltage to the upper electrode during the first sub-period and apply a second negative DC voltage to the upper electrode during the second sub-period, the first negative DC voltage being lower than the second negative DC voltage.

2. The plasma processing system according to claim 1, wherein a substrate on the substrate support has a positive potential during the first sub-period and a negative potential during the second sub-period.

3. The plasma processing system according to claim 1, wherein a substrate on the substrate support has a negative potential during the first sub-period and a positive potential during the second sub-period.

4. The plasma processing system according to claim 1, wherein the RF power source and the bias power source stop supply of the RF power and the bias power, respectively, during a break period between the first period and the second period.

5. The plasma processing system according to claim 4, wherein the DC power source is configured to apply a third negative DC voltage higher than the first negative DC voltage to the upper electrode during the break period.

6. The plasma processing system according to claim 5, wherein the DC power source applies a fourth negative DC voltage higher than the first negative DC voltage to the upper electrode in the first period.

7. The plasma processing system according to claim 6, wherein the first negative DC voltage is controlled to keep a potential difference between the upper electrode and the lower electrode constant.

8. The plasma processing system according to claim 7, wherein the second negative DC voltage is zero.

9. The plasma processing system according to claim 7, wherein the bias power is an RF bias power having the second frequency.

10. The plasma processing system according to claim 8, wherein the bias power is a pulsed DC voltage that has a first negative level during one of the first sub-period and the second sub-period and has a zero level or a second negative level higher than the first negative level during an other of the first sub-period and the second sub-period.

11. A substrate processing method for use in a plasma processing apparatus,
the plasma processing apparatus including:
a chamber;
a lower electrode disposed in the chamber; and
an upper electrode disposed above the lower electrode;
the method including a plurality of cycles, each cycle comprising:
supplying an RF power at a first power level to the lower electrode or the upper electrode during a first period, the RF power having a first frequency;
supplying the RF power at a second power level lower than the first power level to the lower electrode or the upper electrode during a second period subsequent to the first period;
supplying a bias power to the lower electrode during the second period, the bias power having a second frequency lower than the first frequency, each cycle defined by the second frequency having a first sub-period and a second sub-period;
applying a first negative DC voltage to the upper electrode during the first sub-period; and applying a second negative DC voltage to the upper electrode during the second sub-period, the first negative DC voltage being lower than the second negative DC voltage.

\* \* \* \* \*